United States Patent [19]

Sato et al.

[11] Patent Number: 4,659,227

[45] Date of Patent: Apr. 21, 1987

[54] ALIGNMENT APPARATUS

[75] Inventors: Mitsuya Sato, Yokohama; Minoru Yomoda, Kawasaki, both of Japan

[73] Assignee: Canon Kabushiki Kaisha, Tokyo, Japan

[21] Appl. No.: 699,867

[22] Filed: Feb. 8, 1985

[30] Foreign Application Priority Data

Feb. 13, 1984 [JP] Japan .................................. 59-22890

[51] Int. Cl.$^4$ ............................................. G01B 11/00
[52] U.S. Cl. ..................................... 356/401; 356/394
[58] Field of Search ....................... 356/394, 401, 400

[56] References Cited

U.S. PATENT DOCUMENTS 4,487,505 12/1984 Nakano et al. ...................... 356/401

Primary Examiner—R. A. Rosenberger
Assistant Examiner—Crystal D. Cooper
Attorney, Agent, or Firm—Fitzpatrick, Cella, Harper & Scinto

[57] ABSTRACT

An apparatus for aligning objects on the basis of a signal obtained by scanning marks formed on the objects. A position datum representing the relative position between the objects is extracted on the basis of an extraction level. The marks are scanned a plurality of times and an average is obtained by the plural data provided on the basis of the extraction datum. Those operations are repeated with one or more different extraction levels. In each of the data group corresponding to one of the extraction data, a peculiar or exceptional datum is determined. Among the peculiar data obtained for individual sets of data, a minimum is selected. Thus, an extraction datum which results in the minimum peculiar datum is determined. The average of the position data obtained with this extraction datum is used for bringing the objects into alignment with each other.

2 Claims, 16 Drawing Figures

ALIGNMENT APPARATUS

BACKGROUND OF THE INVENTION

The present invention relates to an alignment apparatus, more particularly to such an alignment apparatus as used, in the process of semiconductor device manufacturing, to align wafers with reticles or masks.

As for such alignment apparatuses, proposals have been made, in U.S. Pat. No. 4,219,719 issued on Aug. 26, 1980 and Japanese Laid-Open Patent Application No. 52826/1983 laid-open on Mar. 29, 1983, for example, wherein the signals obtained by scanning marks on an object are converted to binary signals on the basis of a predetermined slice level to discriminate the position data; and the objects are aligned in accordance with the discrimination.

In semiconductor device manufacturing, it is not easy to keep the same conditions of the surface of the object or the alignment mark, and therefore, conventional apparatuses involve disadvantages. One of them is that the position data varies with the individual scanning operation, and the variations are particularly large, depending upon the slice level, thus making difficult reliable alignment with high precision.

SUMMARY OF THE INVENTION

Accordingly, it is a principal object of the present invention to provide an alignment apparatus which is reliable and precise in the alignment operation.

It is another object of the present invention to provide an alignment apparatus which is conveniently applicable to the process of manufacturing semiconductor devices.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
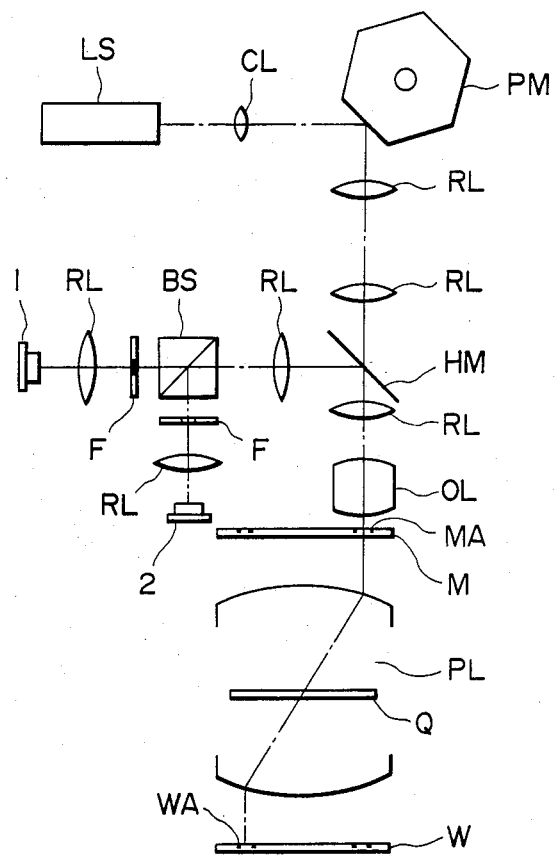
FIG. 1 is a schematic general arrangement of a semiconductor manufacturing device to which the present invention is applicable.

Referring now to FIG. 1, there is shown a semiconductor device manufacturing apparatus, which comprises a sensor 1 for detecting the light scattered by the alignment mark WA formed on the wafer W and another sensor 2 for detecting the light scattered by the alignment mark MA formed on the mask or reticle M. The outputs from the sensors 1 and 2 are coupled to amplifiers 3 and 4 shown in FIG. 3, respectively. On the mask M, a circuit pattern for the semiconductor device to be manufactured is formed; and on the wafer W, a photosensitive layer is formed. The mask M is irradiated by light from an unshown illumination source, whe upon the circuit pattern on the mask M is projecte onto the wafer W through a projection lens PL. To accomplish this, the mask M and the wafer W are conjugate with respect to the projection lens PL. The apparatus further comprises an objective lens OL, a relay lens RL, a condenser lens CL and a half-mirror HM. A polygonal mirror PM rotates in a predetermined direction at high speed to scanningly deflect a beam. The apparatus further comprises a polarization beam splitter BS and λ/4 plate Q. A laser source LS produces a linearly polarized laser beam. A spatial filter F allows the transmission only of the light which has been scattered by the mark MA and WA of the mask M and wafer W, respectively. The polygonal mirror PM receives the laser beam from the laser source LS and causes the beam to scan the marks MA and WA. During the scan, the light returned from the mask M or wafer W is introduced by way of the half mirror HM to the beam splitter BS, which effects separation between the light from the wafer W and the light from the mask M on the basis of the component of the linear polarization. Thereafter, each is filtered by the filter F. Thus, the sensor 1 receives the light from the wafer alignment mark WA, while the sensor 2 receives the light from the mask alignment mark MA.

Figure 2A:
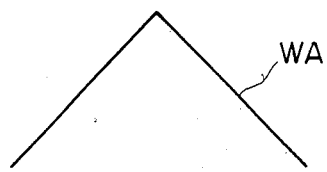
FIGS. 2A, 2B and 2C show examples of alignment marks.
Figure 2B:
Figure 2C:
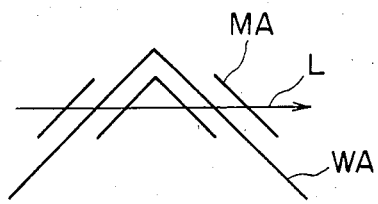

FIGS. 2A and 2B show in detail the alignment mark WA of the wafer W and the alignment mark MA of the mask M, respectively. The alignment between the wafer W and the mask M is accomplished by bringing them into the state shown in FIG. 2C, after the alignment marks WA and MA are detected in the manner described above. The marks WA and MA are in a predetermined relation with respect to the pattern of the actual device. Therefore, when the marks WA and MA are brought into the predetermined relation, the pattern of the mask M and the pattern on the wafer W are correctly aligned. If the positional relation between the mark WA and the mark MA is correctly detected, the alignment is accomplished by operating a driving mechanism so as to eliminate the detected positional difference. For aligning the wafer W and the mask M, it is required that all of the two-dimensional position parameters are controlled in a plane perpendicular to the optical axis of the projection lens PL. To accomplish this, the usual method is based on the observations at different plural positions on the wafer W and the mask M.

Figure 3:
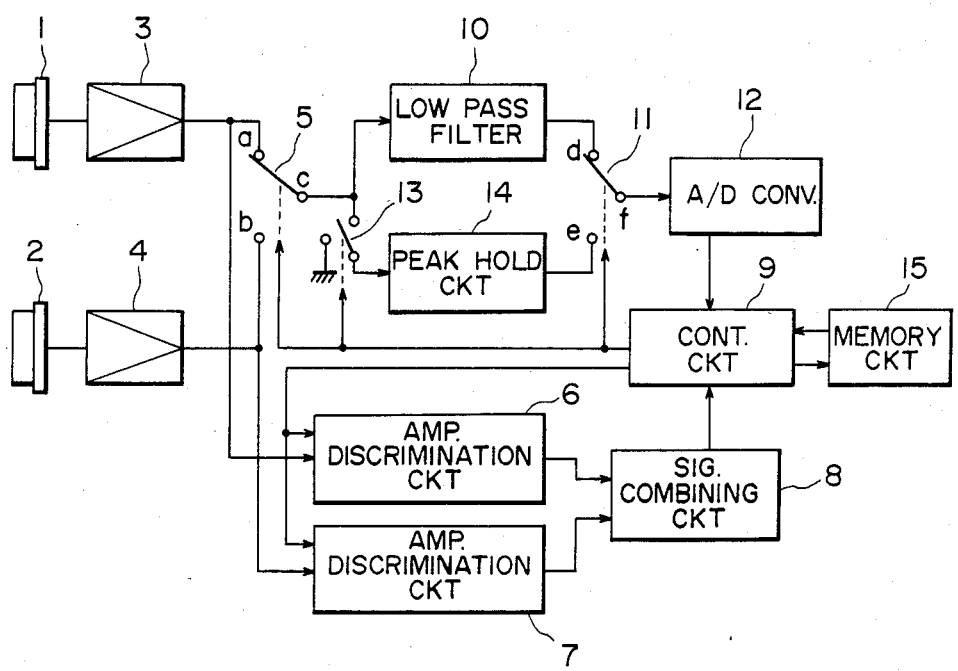
FIG. 3 is a block diagram of an alignment apparatus according to an embodiment of the present invention.

FIG. 3 is a block diagram of an embodiment according to the present invention. The output of the first sensor 1 for detecting the light signal from the wafer W and that of the second sensor 2 for detecting the light signal from the mask M are connected to the amplifiers 3 and 4, respectively. The output of the amplifier 3 is coupled to a terminal a of a non-contact switch 5 which is effective to select one of the output signals from the amplifier 3 and the amplifier 4. It is also connected to an amplitude discrimination circuit 6. Similarly, the output of the amplifier 4 is connected to a terminal b of the switch 5 and to an amplitude discrimination circuit 7. The amplitude discrimination circuits 6 and 7 are connected, through a signal combining circuit 8 for selectively extracting the necessary signal component, to a control circuit 9 provided with a processor.

Figure 4:
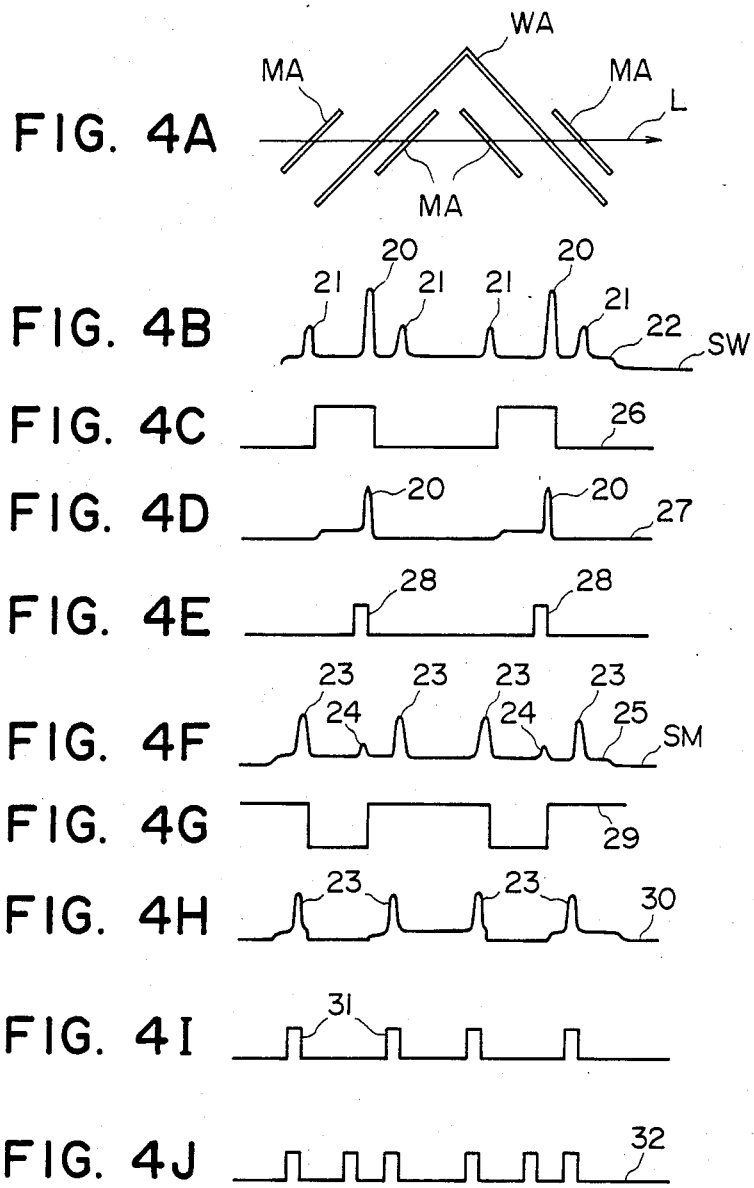
FIGS. 4A, 4B, 4C, 4D, 4E, 4F, 4G, 4H, 4I and 4J illustrate the timings of the signal processing according to the embodiment of the present invention.

The output from the amplifier 3 or 4 which has been transmitted through the terminal c of the switch 5 is transmitted through a low-pass filter 10 and contacts d and f of a switch 11 to an AD converter 12. The outputs of the amplifiers 3 and 4 are transmitted through a switch 13 to a peak-holding circuit 14 and then transmitted through contact e and f of the switch 11 to the AD converter 12. The AD converter 12 is coupled to the control circuit 9. The control circuit 9 stores in a memory circuit 15 the value provided by the AD converter 12 and the signal combining circuit 8, and transmits to the amplitude discrimination circuits 6 and 7 slice levels which are obtained in the manner that will be described hereinafter. The control circuit 9 functions also to transmit switching instructions to the switches 5, 11 and 13. When the alignment marks WA and MA are in such a relation as shown in FIG. 4A, the laser beam scans them, as shown by an arrow L. Then, the sensor 1 detects the light signal given from the wafer alignment mark WA. The detection signal Sw of the sensor 1 contains not only the pattern signal 20 associated with the pattern of the wafer alignment mark WA but also unstable signal 21 of the mask alignment mark MA pattern produced by the light interference, as shown in FIG. 4B. Additionally, the detection signal Sw contains a signal component 22, which is like a bias signal, this component being produced by the light uniformly reflected by the surface of the wafer W.

The detection signal Sm by the second sensor 2 contains not only the pattern signal 23 associated with the pattern of the mask alignment mark MA, but also lower level signal 24 produced by the wafer alignment mark WA, as shown in FIG. 4F. Similarly to the detection signal by the first sensor 1, the detection signal contains the signal component 25 provided by the uniformly reflected light by the surface of the mask M. The scanning operation by the laser beam is repeated in the same direction a plurality of times, and the detection signals Sw and Sm are introduced at all times into the amplitude discrimination circuits 6 and 7. However, to the low-pass filter 10 and to the peak holding circuit 14, the signals selected by the switch 5 is introduced, the switch 5 being controlled by the control circuit 9. When the contacts a and c of the switch 5 are contacted, the detection signal Sw of the wafer W is directed to the low-pass filter 10 and the peak holding circuit 14. The low-pass filter 10 is effective to cut each of the peak portions 20 and 21 and allows only a uniform signal component to pass therethrough. To the peak holding circuit 14, the detection signal Sw is introduced through a switch 13. The switch 13 is actuated at the timing shown by a signal 26 (FIG. 4C) by the control circuit 9 so as to pass only the second and fifth pulses. The switch 13 is closed in the above-described, because the required signals in the detected output Sw are the second and fifth signals 20, counted along the direction of scan L. Therefore, the signals are reformed into the state shown in FIG. 4D by reference numeral 27 and then are introduced to the peak holding circuit 14. The peak level of the pattern signal 20 in the signal 27 is held and transmitted to the AD converter 12 through the switch 11. The AD converter 12 converts the held signal and the output of the low-pass filter 10 to respective digital signals, which are transmitted to the control circuit 9. The control circuit 9 effects subtraction one from the other of the digitalized amounts so as to produce the actual peak level of the pattern signal for the wafer W. A slice level is obtained by multiplying the peak level by a value which is stored in the memory circuit 15 and which is predetermined as a value lower than 1. The resultant slice level is directed to the amplitude discrimination circuit 6. The amplitude detecting circuit 6 converts the detection signals Sw to digital signals and catches only the peak signals that reach the above-described slice level. The amplitude discrimination circuit 6 further converts the caught signals to rectangular pulse signals 28 having a predetermined level as shown in FIG. 4E and having the signal width equal to the width of the signal 20 at the slice level, and transmits the converted signals to the signal combining circuit 8.

On the other hand, the detection signal Sm obtained from the alignment mark pattern MA of the mask M, as shown in FIG. 4F are allowed to reach the low-pass filter 10 and so on, only when the contacts b and c of the switch 5 are contacted. The switch 13 is operated in accordance with instruction signals 29 shown in FIG. 4G, which are reversal of the instruction signals 26 shown in FIG. 4C. The subsequent signal processing is similar to the case of the detection signal Sw. Namely, the signal 30 shown in FIG. 4H is produced, which corresponds to the signal shown in FIG. 4D in the case of the detection signal Sw. Then, the amplitude discrimination circuit 7 produces the pulse signal 31 as shown in FIG. 4I. The signal combining circuit 8 combines the pulse signal 28 shown in FIG. 4E and the pulse signal 31 shown in FIG. 4I to produce the signal 32 shown in FIG. 4J. The signal 32 is transmitted to the control circuit 9 and is used for the purpose of alignment operation.

The foregoing explanation has been made with respect to a single scan of the laser beam. In this embodiment, however, the laser scan is repeated on the basis of a single slice level a plurality of times (M). The pattern position data D11, D12, ..., D1M obtained by the plural scanning operation, are stored in the memory circuit 13 by way of the control circuit 9. The initial slice level SL1 is predetermined empirically. After the completion of the M times scanning operation on the basis of the initially set slice level, additional M times scanning operations are repeated on the basis of another slice level SL2 which is slightly higher than the initial slice level SL1. The resultant pattern position data D21, D22, ..., D2M are stored in the memory circuit 15. Thereafter, the control circuit 9 instructs a further slice level SL3 to the amplitude discriminating circuits 6 and 7. The pattern position data D31, D32, ..., D3M obtained by the further scanning operation are stored in the memory circuit 15.

Thus, the control circuit 9 changes the slice level from SL1 to SLN a plurality of times (N), and all of the data are stored in the memory circuit 15. The memory circuit 15 further stores different values which are all lower than 1 so as to permit the setting of N slice levels SL1 ... SLN.

The control circuit 9, then determines the maximum deviation (the maximum deviation from the average) from the pattern position data Dnm for each of the groups, each of the groups being based on a common slice level. Thus, maximum deviations are determined for individual groups. Among those groups, one is selected which is minimum in the maximum deviation. The selected group has a common slice level SLq. An average Aq of the pattern position data Dq1, Dq2, ..., DqM which have been obtained on the basis of the slice level SLq, is determined, and the average is used as the pattern position data for the alignment operation. Because of this process, if the signals from the mask M and wafer W involved a disturbance by an interference, for example, the exceptional data are omitted, so that a reliable and high precision alignment can be accomplished.

Figure 5:
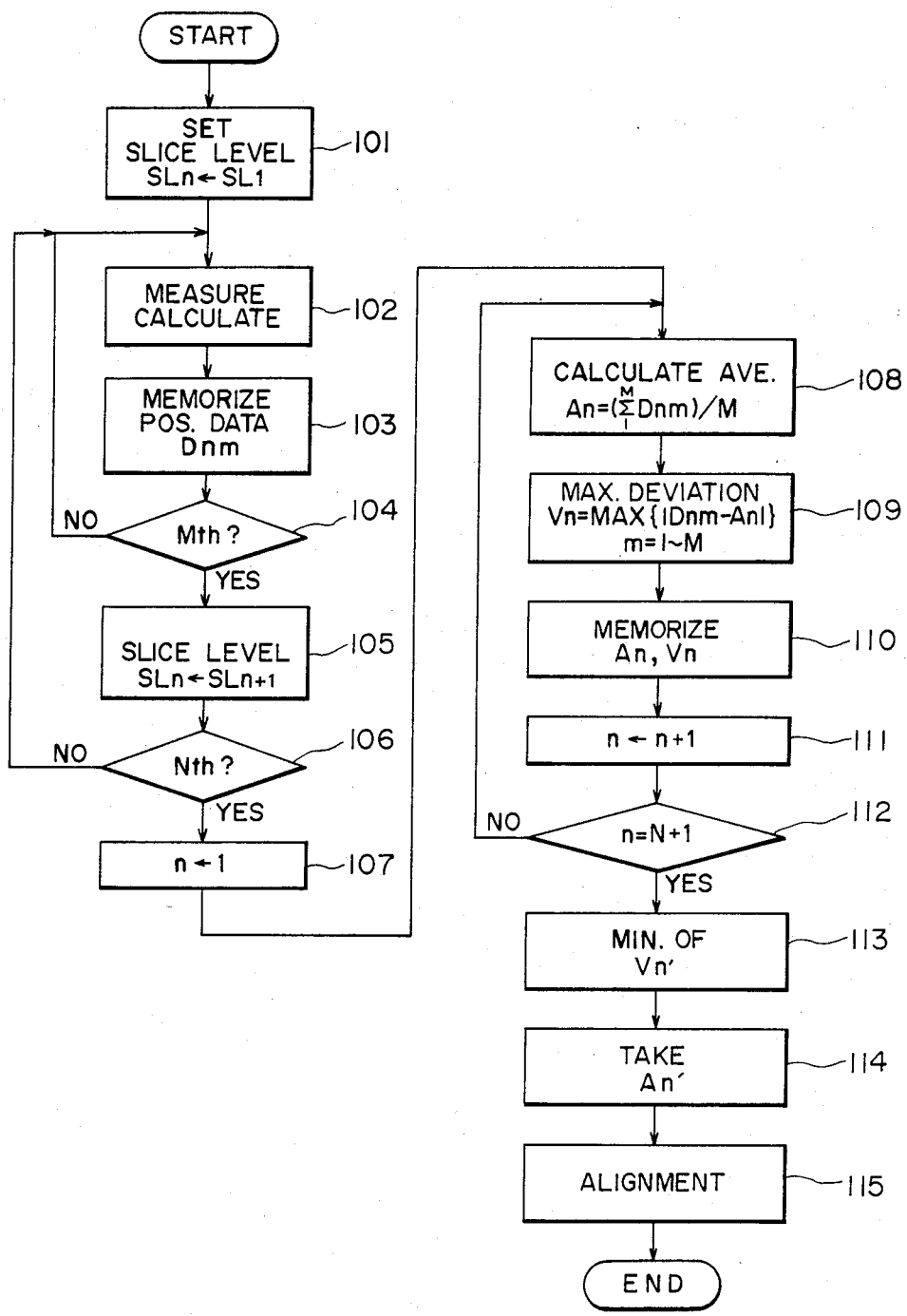
FIG. 5 is a flow chart showing the operation of the apparatus according to the embodiment of the present invention.

The operation of the apparatus according to this embodiment will now be described in conjunction with FIG. 5. Upon the alignment instructions, the operations start. The control circuit 9 determines the initial slice level SLn, at step 101, by multiplying the peak signal from the peak holding circuit 14 by the initial slice level data (lower than 1) provided by the memory circuit 15. The determined slice level SLn is transmitted to the amplitude discrimination circuits 6 and 7. Then, at step 102, the alignment marks WA and MA are scanned by the laser beam, and sensors 12 produce the outputs during the scanning operation, which outputs are transmitted to the control circuit 9, where the position data Dnm are obtained and stored in the memory circuit 15 at step 103. Then, the discrimination is made as to whether or not the scanning operations have been repeated M times, at step 104. If not, the sequence goes back to step 102, and the above described operations are repeated. If so, the sequence advances to step 105, where the slice level SLn is changed to SLn+1. (The above SLn should be changed to SLn+1). At step 106, the discrimination is made as to whether or not the slice level SLn has been changed N times. If not, the sequence goes back to step 102 to repeat the above described measurement and processing. If so, the sequence goes to 107, where the number N is reset to 1.

At step 108, an average An is obtained from M position data Dnm provided on the basis of the slice level SLn. At step 109, the deviation between each of the position data Dnm and the average An is determined, and among the resultant deviations, the maximum one (this is called "maximum deviation Vn") is determined. Then, the average An and the maximum deviation Vn provided at the steps 108 and 109 are stored in the memory circuit 15 at step 110. Thereafter, at step 111, the number "n+1" is replaced by a number "n", and the discrimination is made at step 112 as to whether or not "n" is equal to "N+1". If not, the sequence goes back to step 108, where an average An and a maximum deviation Vn are obtained on the basis of the next slice level SLn. Thus, this loop of operation is repeated a plurality of times (the number of the slice levels SLn, that is, N). After the N times repetition, the sequence goes from the step 112 to a step 113, where the minimum is determined from the maximum deviations V1, V2, ..., VN which correspond to the slice levels SL1, SL2, ..., SLN, respectively. After the minimum one Vn' is determined, the average An' is read out of the memory circuit 15, which average An' is the average of the position data Dn'1, Dn'2, ..., Dn'M obtained on the basis of the n'th slice level SLn'. The alignment operation between the mask M and wafer W is performed on the basis of the data An' at step 115 until they are properly aligned.

The foregoing explanation has been made with respect to an embodiment wherein a laser beam is used for the scanning operation, however, this is not limiting. The present invention is applicable to another type, for example, in which the signals are taken out of TV scanning lines.

It is a possible alternative that, at step 109, a standard deviation, rather than the maximum deviation, is obtained from the position data, and the minimum standard deviation is taken. That is, the slice level which results in the minimum standard deviation is determined, and the average of the position data obtained on the basis of the slice level is used for the purpose of alignment operation.

As described in the foregoing, according to the present invention, the extraordinary or exceptional signal which may otherwise be introduced due to a disturbance is effectively omitted so as to achieve a high precision and reliable alignment between objects.

While the invention has been described with reference to the structures disclosed herein, it is not confined to the details set forth and this application is intended to cover such modifications or changes as may come within the purposes of the improvements or the scope of the following claims.

What is claimed is:

1. An alignment apparatus for aligning objects on the basis of a signal obtained by scanning marks on the objects, comprising:
   means for scanning the marks on the objects;
   means for sensing the marks during the scanning operation by said scanning means;
   means for bringing the objects into alignment with each other, wherein said alignment means (i) obtains relative position data from said sensing means on the basis of an extracting datum selected from a plurality of different extracting data; (ii) repeats the position data obtaining operation a plurality of times with repetition of the scanning operation to obtain a plurality of relative position data; and (iii) determines an average of the relative position data and also determines the maximum deviation from the average;
   wherein said alignment means is further adapted to repeat operations (i) through (iii) with a different extracting datum and said alignment means performs its alignment operation on the basis of the average of the relative position data corresponding to the minimum of the maximum deviations obtained by the repeated operations.

2. An alignment apparatus for aligning objects on the basis of a signal obtained by scanning marks on the objects, comprising:
   means for scanning the marks on the objects;
   means for sensing the marks during the scanning operation by said scanning means;
   means for deriving from outputs of said sensing means a position datum for determining the relative position between the objects;
   means for storing a plurality of extraction data, on the basis of which the deriving means derives the datum for determining the relative position between the objects;
   means for bringing the objects into alignment with each other;
   wherein said aligning means is adapted to obtain plural position data which individually correspond to the extraction data, and is further adapted to select from the plural position data one position datum, on the basis of which the alignment operation is effected; and
   wherein said scanning means scans the marks a plurality of times on the basis of each of the extraction data, and said aligning means effects its aligning operation on the basis of a position datum obtained from a group of position data wherein the maximum deviation is minimum.

* * * * *